United States Patent
Salling et al.

(10) Patent No.: US 6,449,187 B1
(45) Date of Patent: Sep. 10, 2002

(54) METHOD AND APPARATUS FOR PROGRAMMING FLASH MEMORY DEVICE

(75) Inventors: Craig Thomas Salling; Kemal Tamer San, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/907,341

(22) Filed: Jul. 17, 2001

(51) Int. Cl.$^7$ .............................................. G11C 11/34
(52) U.S. Cl. .............................. 365/185.02; 365/185.14
(58) Field of Search ..................... 365/185.28, 185.02, 365/185.27, 185.18, 185.14, 185.01, 185.29

(56) References Cited

U.S. PATENT DOCUMENTS

| | | |
|---|---|---|
| 5,412,603 A | 5/1995 | Schreck et al. |
| 5,596,528 A | 1/1997 | Kaya et al. |
| 5,875,130 A | 2/1999 | Haddad et al. |
| 5,963,473 A * | 10/1999 | Norman .................. 365/185.02 |
| 6,351,417 B1 * | 2/2002 | Shiga et al. ............ 365/185.11 |

* cited by examiner

*Primary Examiner*—Richard Elms
*Assistant Examiner*—Hien Nguyen
(74) *Attorney, Agent, or Firm*—Jacqueline J. Garner; W. James Brady, III; Frederick J. Telecky, Jr.

(57) ABSTRACT

The method is for programming a memory cell in an array of cells having a plurality of bit lines, each with bit-line coupled cells, and a plurality of word lines, each with word-line coupled cells. A word line-bit line combination identifies a target cell. Each cell has a drain, source, gate and floating gate arrayed upon a base common to the cells, all of which cooperate to establish a floating gate-to-source field in each cell. The method includes the steps of: (a) applying a select signal to a word line and a bit line coupled with the target cell; (b) providing an adjusted signal to the bit-line coupled cells to decrease strength of the floating gate-to-drain field for the bit-coupled cells; (c) programming the target cell; and (d) maintaining the adjusted signal at least until the programming is complete.

21 Claims, 4 Drawing Sheets

800
REDUCTION OF CELL THRESHOLD VOLTAGE ($V_t$) DUE TO 100 ms PROGRAM DISTURB

900

METHOD AND APPARATUS FOR PROGRAMMING FLASH MEMORY DEVICE

BACKGROUND OF THE INVENTION

The present invention is directed to flash memory devices. In particular, the present invention is directed to flash memory devices including an array of memory cells coupled with a plurality of word lines and bit lines oriented to facilitate identifying particular cells of the array of cells. The present invention involves a treatment of such a flash memory device during programming operations in which a target cell is selected for programming by a designating word line-bit line combination. The present invention facilitates programming of the selected target cell while reducing disturbance of other cells coupled with the designating bit line that are not being programmed.

A typical flash memory cell in a flash memory array is embodied in an NMOS transistor with an integral storage element in the form of a capacitor. The storage element (i.e., the capacitor) is typically incorporated in the memory cell as a floating silicon gate sandwiched between NMOS material and a control gate. The capacitor is typically encapsulated in an oxide material to effect the required isolation to establish the necessary floating character of the storage element.

Charging and discharging the floating gate in a flash memory cell modulates the threshold voltage $V_t$ of the underlying NMOS transistor, and that change in threshold voltage is used as a memory state indication.

When a particular cell in a memory array is selected for programming, selection is made using a bit line-word line combination to uniquely select a particular cell. That is, a selecting bit line and a selecting word line are used to select a target cell for programming. Other cells are also coupled with the selecting word line, and other cells are coupled with the selecting bit line. These other coupled cells, not selected for programming, are subjected to some of the signals required for programming the selected target cell. Some of the programing signals, particularly those present on the selecting bit line, may disrupt programming of cells also coupled with the selecting bit line but not selected for programming. Such disruption is known by various terms in industry, including drain stress, drain disturbance and bit line stress.

There is a need for a way to reduce drain stress on cells not selected for programming yet coupled with a selecting bit line identifying a target cell for programming.

SUMMARY OF THE INVENTION

The method treats a flash memory cell array while programming a memory cell in an array having a plurality of addressable cells. The array has a plurality of bit lines coupled with at least one respective bit-coupled cell of the addressable cells. The array has a plurality of word lines coupled with at least one respective word-coupled cell of the addressable cells. Respective cells of the addressable cells are coupled with at least one word line and with at least one bit line. A respective word line-bit line combination identifies a particular cell as a target cell. Each respective cell has a drain, a source, a gate and a floating gate arrayed upon a base. The base is common to the cells. The drain, the source, the gate, the floating gate and the base cooperate to establish a floating gate-to-source electromagnetic field in each respective cell. The method includes the steps of: (a) selecting the target cell for programming by applying, in no particular order: (1) a word select programming signal to a particular word line coupled with the target cell; and (2) a bit select programming signal to a particular bit line coupled with the target cell; (b) providing at least one adjusted signal to the at least one bit-coupled cell coupled with the particular bit line to effect a decrease in strength of the floating gate-to-drain field for the at least one bit-coupled cell; (c) programming the target cell; and (d) maintaining the at least one adjusted signal at least until the programming of the target cell is complete.

The apparatus of the invention is embodied in a flash memory device configured for programming a target cell among a plurality of addressable cells arranged in an array. The array has a plurality of bit lines, each respective bit line being coupled with at least one respective bit-coupled cell, and a plurality of word lines, each respective word line being coupled with at least one respective word-coupled cell. Respective cells of the plurality of addressable cells are coupled with at least one word line and with at least one bit line. A respective word line-bit line combination identifies a particular addressable cell as the target cell. Each respective cell has a respective drain, a respective source, a respective gate and a respective floating gate arrayed upon a base. The base is common to at least some cells of the plurality of addressable cells. The respective drain, the respective source, the respective gate, the respective floating gate and the base cooperate to establish a floating gate-to-source electromagnetic field in each respective cell. A word select programming signal is applied to a particular word line coupled with the target cell, and a bit select programming signal is applied to a particular bit line coupled with the target cell. At least one adjusted signal is provided to the at least one bit-coupled cell coupled with the particular bit line. The at least one adjusted signal effects a decrease in strength of the floating gate-to-drain electromagnetic field for the at least one bitcoupled cell coupled with the particular bit line at least during programming of the target cell.

It is, therefore, an object of the present invention to provide a method and apparatus for reducing drain stress on cells in a flash memory array that not selected for programming yet are coupled with a selecting bit line identifying a target cell for programming.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
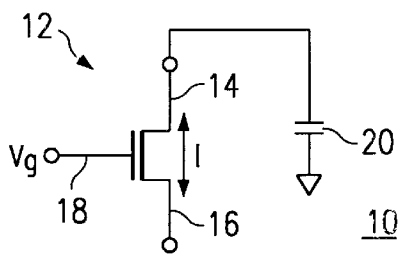
FIG. 1 is an electrical schematic diagram illustrating a typical DRAM memory cell.

FIG. 1 is an electrical schematic diagram illustrating a typical DRAM memory cell. In FIG. 1, a DRAM (Dynamic Random Access Memory) cell 10 includes an NMOS (N-channel Metal Oxide Semiconductor) pass gate transistor 12 having a drain 14, a source 16 and a gate 18. A capacitor 20 is connected with drain 14. Capacitor 20 is charged when NMOS transistor 12 is gated on and conducting a current I between source 16 and drain 14, as occurs during a write operation. After capacitor 20 is thus charged, data is stored, and NMOS transistor 12 is turned off (i.e., rendered non-conducting) by changing bias voltage $V_g$ on gate 18. The charge on capacitor 20 is sensed using a sense amplifier (not shown in FIG. 1) when NMOS transistor 12 is turned on during a read or refresh operation. The charge on capacitor 20 is used to generate input current to sense amplifiers, so sensing is a destructive operation. That is, charge on capacitor 20 is dissipated during a read and refresh operations of DRAM memory cell 10. The charge on capacitor 20 (i.e., the data stored in DRAM memory cell 10) thus must be restored after a read or refresh operation. Such charge restoration is commonly carried out using another write operation. It is this dissipation and restoration of charge in reading DRAM memory cell 10 that characterizes DRAM memory cell 10 as a volatile memory device.

Figure 2:
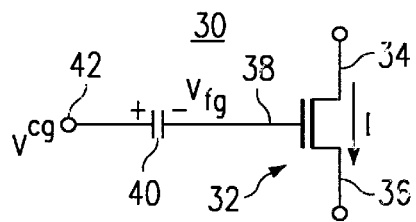
FIG. 2 is an electrical schematic diagram illustrating a typical flash memory cell.

FIG. 2 is an electrical schematic diagram illustrating a typical flash memory cell. In FIG. 2, a flash memory cell 30 includes an NMOS (N-channel Metal Oxide Semiconductor) pass gate transistor 32 having a drain 34, a source 36 and a gate 38. A capacitor 40 is connected with gate 38 and with a charging gate terminal 42. A charging voltage $V_{cg}$ may be applied to charging gate terminal 42 to effect charging of capacitor 40. The arrangement of capacitor 40 and gate 38 with respect to charging gate terminal 42 renders gate 38 as a floating gate, not directly connected with charging gate terminal 42 and therefore not directly receiving charging voltage $V_{cg}$.

When capacitor 40 is negatively charged, the charge operates to decrease the effect of floating gate bias voltage $V_{fg}$ on operation of gate 38. As a result of the decrease of floating gate bias voltage $V_{fg}$, transistor 32 is more difficult to turn on to assume a conducting state for passing a current I between drain 34 and source 36. That is, the threshold voltage $V_t$ of transistor 32 is increased when capacitor 40 is negatively charged.

When capacitor 40 is discharged or is positively charged, transistor 32 is more easily placed into a conducting state; the threshold voltage $V_t$ of transistor 32 is lowered. Current at gate 38 is low, so the charge on capacitor 40 is not susceptible to discharging from capacitor 40. It is because of this relative stability of charge carried by capacitor 40 that flash memory 30 is regarded as a non-volatile memory device.

Figure 3:
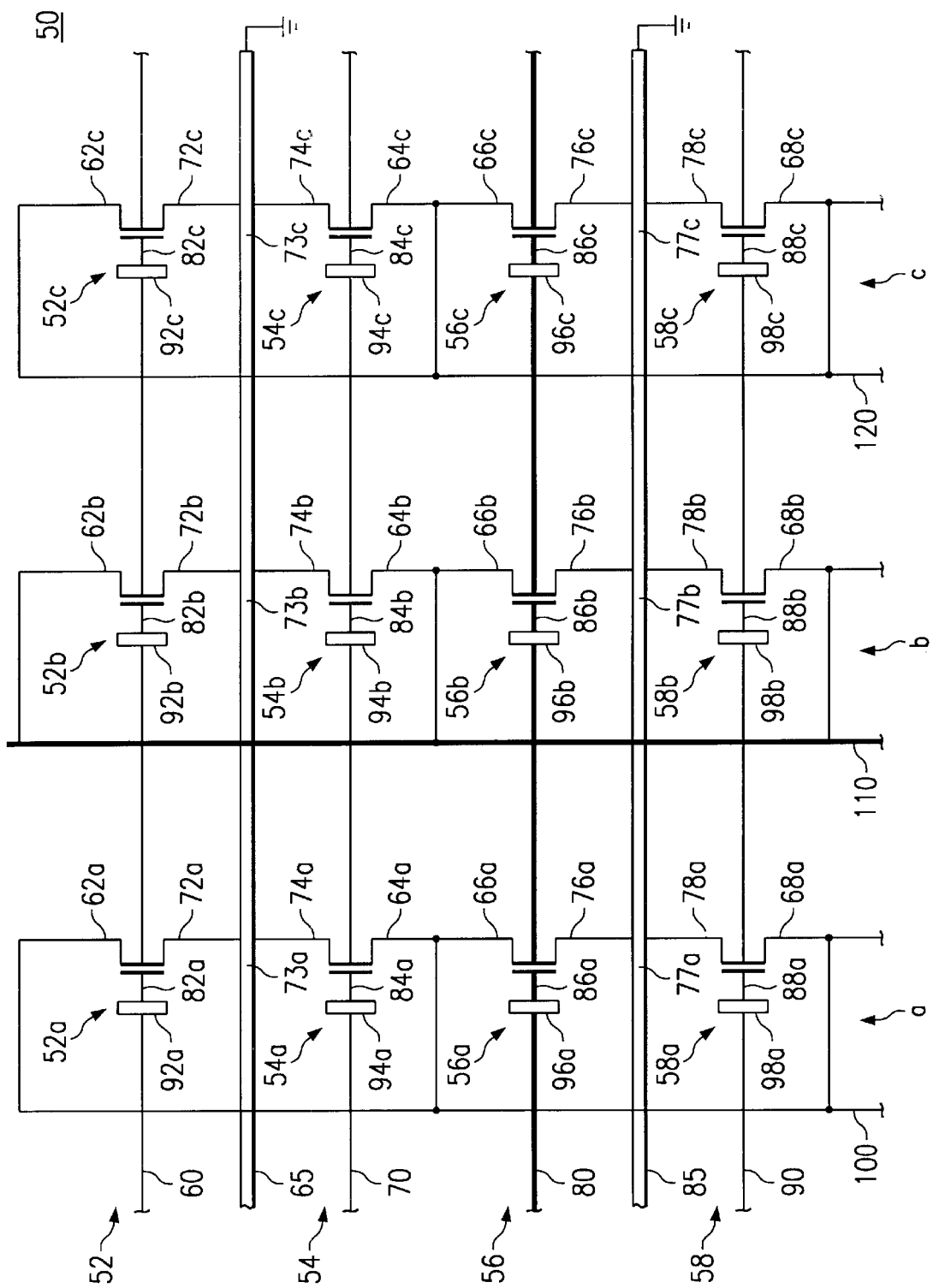
FIG. 3 is an electrical schematic diagram illustrating a representative array of flash memory cells configured for programming operations.

FIG. 3 is an electrical schematic diagram illustrating a representative array of flash memory cells configured for programming operations. In FIG. 3, a flash memory array 50 has a plurality of flash memory cells 52 arranged in a plurality of rows 52, 54, 56, 58 and columns a, b, c. Accordingly, flash memory cell 52a is located in row 52, column a of flash memory array 50. Flash memory cell 52b is located in row 52, column b of flash memory array 50. Flash memory cell 52c is located in row 52, column c of flash memory array 50. Flash memory cell 54a is located in row 54, column a of flash memory array 50. Flash memory cell 54b is located in row 54, column b of flash memory array 50. Flash memory cell 54c is located in row 54, column c of flash memory array 50.

Flash memory cell 56a is located in row 56, column a of flash memory array 50. Flash memory cell 56b is located in row 56, column b of flash memory array 50. Flash memory cell 56c is located in row 56, column c of flash memory array 50.

Flash memory cell 58a is located in row 58, column a of flash memory array 50. Flash memory cell 58b is located in row 58, column b of flash memory array 50. Flash memory cell 58c is located in row 58, column c of flash memory array 50.

Each respective memory cell has a drain, a source, a floating gate and a storage capacitor. Thus memory cell 52a has a drain 62a, a source 72a, a floating gate 82a and a storage capacitor 92a. Memory cell 52b has a drain 62b, a source 72b, a floating gate 82b and a storage capacitor 92b. Memory cell 52c has a drain 62c, a source 72c, a floating gate 82e and a storage capacitor 92c.

Memory cell 54a has a drain 64a, a source 74a, a floating gate 84a and a storage capacitor 94a. Memory cell 54b has a drain 64b, a source 74b, a floating gate 84b and a storage capacitor 94b. Memory cell 54c has a drain 64c, a source 74c, a floating gate 84c and a storage capacitor 94c.

Memory cell 56a has a drain 66a, a source 76a, a floating gate 86a and a storage capacitor 96a. Memory cell 56c has a drain 66b, a source 76b, a floating gate 861 and a storage capacitor 964. Memory cell 56c has a drain 66c, a source 76c, a floating gate 86c and a storage capacitor 96c.

Memory cell 58a has a drain 68a, a source 78a, a floating gate 88a and a storage capacitor 98a. Memory cell 58b has a drain 68b, a source 78b, a floating gate 88b and a storage capacitor 98b. Memory cell 58c has a drain 68c, a source 78c, a floating gate 88c and a storage capacitor 98c.

Flash memory array 50 includes a plurality of word lines 60, 70, 80, 90 coupling respective capacitors 92x, 94x, 96x, 98x in respective rows 52, 54, 56, 58. Thus, word line 60 couples capacitors 92a, 92b, 92c in row 52. Word line 70 couples capacitors 94a, 94b, 94c in row 54. Word line 80 couples capacitors 96a, 96b, 96c in row 56. Word line 90 couples capacitors 98a, 98b, 98c in row 58.

Flash memory array 50 further includes a plurality of source lines 65, 85 coupling sources 72x, 74x, 76x, 78x in adjacent rows 52, 54, 56, 58. Thus, source line 65 couples sources 72a, 74a at a common juncture 73a. Source line 65 couples sources 72b, 74b at a common juncture 73b. Source line 65 couples sources 72c, 74c at a common juncture 73c.

In similar fashion, source line 85 couples sources 76a, 78a at a common juncture 77a. Source line 85 couples sources 76b, 78b at a common juncture 77b. Source line 85 couples sources 76c, 78c at a common juncture 77c.

Flash memory array 50 still further includes a plurality of bit lines 100, 110, 120 coupling drains 62x, 64x, 66x, 68x in columns a, b, c. Thus, bit line 100 couples drains 62a, 64a, 66a, 68a in column a. Bit line 110 couples drains 62b, 64b, 66b, 68b in column b. Bit line 120 couples drains 62c, 64c, 66c, 68c in column C.

In such an arrangement as illustrated for flash memory array 50, selection of a particular word line 60, 70, 80, 90 and a particular word line 100, 110, 120 serves to designate a particular memory cell 52x, 54x, 56x, 58. Thus, for example in FIG. 3, designation of word line 80 and bit line 110 (shown in bold lines in FIG. 3) uniquely designate memory cell 56b. Designation of word line 80 and bit line 110 is accomplished by applying predetermined potentials to those respective lines 80, 110. The particular potentials applied to respective lines vary according to the operation to be carried out with flash memory array 50. In FIG. 3, flash memory array 50 is configured for programming memory cell 56b; accordingly a word line programming potential is applied to word line 80 and a bit line programming potential is applied to bit line 110. In the programming configuration illustrated in FIG. 3, source lines 65, 85 are grounded at zero volts potential. A representative value for an appropriate word line programming potential is 8 volts. A representative value for a bit line programming potential is 4 volts.

Figure 4:
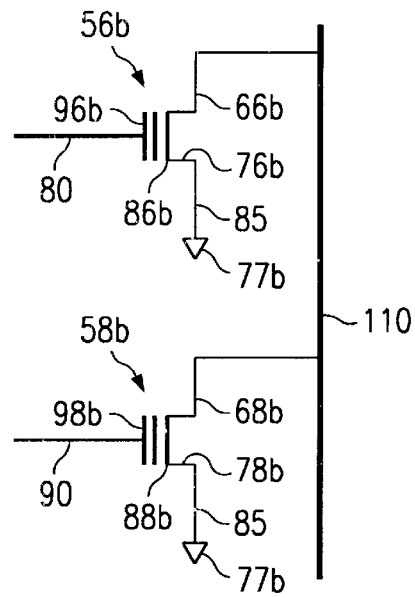
FIG. 4 is an electrical schematic diagram of a portion of the array illustrated in FIG. 3.

FIG. 4 is an electrical schematic diagram of a portion of the array illustrated in FIG. 3. In FIG. 4, memory cell 56b is coupled with word line 80 by capacitor 96b, and is coupled with bit line 110 by drain 66b. Source 76b is grounded at juncture 77b via source line 85. Memory cell 58b is coupled with word line 90 by capacitor 98b, and is coupled with bit line 110 by drain 68b. Source 78b is grounded at juncture 77b via source line 85. Memory cell 56b is the selected cell for programming in FIG. 4 (as it was in FIG. 3) because a word line programming potential of 8 volts is applied to word line 80 and a bit line programming potential of 4 volts is applied to bit line 110.

Of interest in FIG. 4 in connection with the present invention are the potentials applied to memory cell 58b. In particular, since memory cell 58b is not selected for programming, potential applied to capacitor 98b by word line 90 is zero volts (according to prior art practice). However, memory cell 58b shares bit line 110 with selected memory cell 56b, and a programming potential (i.e., 4 volts) is applied to b it line 110 in order to effect selection of memory cell 56b for programming, as described above. Therefore, memory cell 58b has a potential of 4 volts applied to drain 68b. In fact, all memory cells sharing bit line 110 (i.e., memory cells 52b, 54b, 56b, 58b; FIG. 3) have a programming potential (i.e., 4 volts) applied to their respective drains 62b, 64b, 66b, 68b.

Thus, discussions that follow regarding stresses and other phenomena in connection with memory cell 58b apply equally with all non-selected memory cells 52b, 54b, 58b in column b and commonly connected with bit line 110 when memory cell 56b is selected for programming operations.

Figure 5:
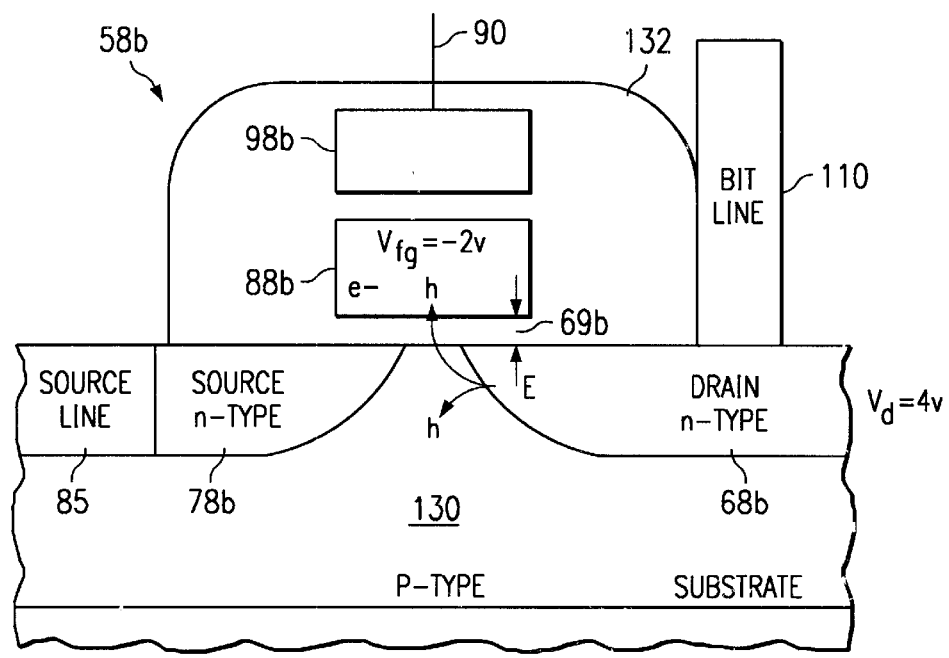
FIG. 5 is a schematic elevation section view of a flash memory cell.

FIG. 5 is a schematic elevation section view of a flash memory cell. In FIG. 5, memory cell 58b includes drain 68b preferably fashioned of n-type material, source 78b preferably fashioned of n-type material and source line 85 arrayed upon a substrate 130. Substrate 130 is preferably fashioned of p-type material. Drain 68b is connected with bit line 110; source 78b is connected with source line 85. Source line 85 is coupled to ground potential at a common juncture 77b (see FIGS. 3 and 4; not shown in FIG. 5). Memory cell 58b further includes an oxide deposition 132 substantially enclosing floating gate 88b and capacitor 98b. Capacitor 98b is connected with word line 90.

When memory cell 56b (not shown in FIG. 5) is configured for programming, as discussed in connection with FIGS. 3 and 4, memory cell 58b (and other memory cells connected with bit line 110) is affected. A potential of zero volts is present at word line 90 (according to prior art practice) because memory cell 58b is not selected for programming. A potential of 4 volts is present at bit line 110 because bit line 110 is involved in selecting memory cell 56b as the selected programming cell (see discussion in connection with FIGS. 3 and 4).

The programming potential (4 volts) at bit line 110 places substantially the same potential at drain 68b. If for example, memory cell 58b is storing a binary "digit" in the form of a negative charge, a floating gate potential $V_{fg}$ is established that is on the order of −2 volts. In such a representative situation, a zero volt potential at word line 90 cooperates with the programming potential (4 volts) at drain 68b to establish an electric field E across the junction 69b between floating gate 88b and drain 68b. A programming potential at drain 68b also establishes a potential between drain 68b and substrate 130. The potentials between drain 68b and other sections of memory cell 58b result in a migration of electron holes (represented by "h" in FIG. 5) from drain 68b to floating gate 88b, to substrate 130 and to trapped positions within junction 69b. Substrate 130 is usually at a potential of zero volts (according to prior art practice), a lower potential than the programming potential present at drain 68b. A significant consequence of hole migration is to reduce the potential at floating gate 88b by reducing the net stored charge in capacitor 98b. The net stored charge can be reduced by holes that reach floating gate 88b and cancel stored charge, or by increasing leakage of stored charge off of floating gate 88b because of the presence of trapped holes injunction 69b. The potential at drain 68b causes floating gate 88b to induce capacitor 98b to leak charge.

Such affecting of non-selected memory cells on a common bit line used for selecting a programming cell is a significant problem with flash memory cells such as memory cell 58b (FIG. 5), and with arrays of flash memory cells, such as flash memory array 50 (FIG. 3). The condition is referred to using a variety of terms—e.g., drain stress, drain disturbance and bit line stress.

Cost pressures and other pressures have driven sizes of components in electronic products toward smaller and more compact designs. The same pressures have caused flash memory designers to produce ever-smaller flash memory arrays. One significant consequence of such smaller sizes of memory cell arrays has been that the lateral overlap of components within a cell to establish electric field E has become smaller. That is, the lateral dimension of junction 69b (FIG. 5) established by overlap of floating gate 88b with respect to drain 68b is smaller. Such reductions in lateral dimensions have resulted in higher intensities of electric field E, given that similar voltages continue to be employed in operating the various arrays. A consequence is that the more compact arrays experience more mobility of electrons and holes across junction 69b, and the problem of gate induced drain leakage (GIDL) is exacerbated. GIDL causes the programmed state of a cell to be disturbed when another cell on the same bit line is programmed from an initially erased state. This disturbance of the state of a cell is referred to as "program disturb".

In the representative configuration of memory cell 58b illustrated in FIG. 5, gate induced drain leakage (GIDL) is represented by the relationship:

$$GIDL = f(V_d - V_{fg}) \quad [1]$$

$V_d$=drain potential (4 volts in FIG. 5);
$V_{fg}$=floating gate potential (−2 volts in FIG. 5)
The function $f(V_d - V_{fg})$ is a monotonically increasing function of $(V_d - V_{fg})$. Therefore, in memory cell 58b (FIG. 5) $(V_d - V_{fg})$=6 volts (i.e., 4 volts−(−2 volts)). That is the strength of electromagnetic field E across junction 69b.

Since floating gate 88b is negative with respect to drain 68b, holes are attracted from drain 68b across junction 69b to populate floating gate 88b. Substrate 130 is also negative with respect to drain 68b, so some holes are also attracted to substrate 130 from drain 68b. Holes attracted to floating gate 88b create trap states in the dielectric of junction 69b and induce leakage of electrons off floating gate 88b. A deleterious result is that programming of floating gate 88b in memory cell 58b is disturbed when memory cell 56b is programmed. There are on the order of 3000 electrons involved in establishing the desired charge on floating gate 88b to maintain a charge recognized as a digital indication (i.e., a digital "1" or a digital "0"), so leakage of relatively few electrons off floating gate 88b through junction 69b significantly affects the charge on floating gate 88b (i.e., to significantly disturb the programming on floating gate 88b). This is a significant source of error that may be experienced by one memory cell (e.g., memory cell 58b) as one programs another memory cell (e.g., memory cell 56b; FIG. 4) on the same bit line 110.

The solution is to reduce the electric field E in the drain-to-floating gate junction 69b. The strength of electrical field E across junction 69b may be reduced by reducing the value of the right side of expression [1].

$$GIDL = f(V_d - V_{fg}) \quad [1]$$

Reducing the difference between drain potential ($V_d$) and floating gate potential ($V_{fg}$) may be accomplished by reducing drain potential $V_d$ or raising floating gate potential $V_{fg}$ to a less-negative value. Placing a positive potential on word line 90 during programming operations on another memory cell sharing bit line 110 (e.g., memory cell 56b, FIG. 4) results in raising floating gate potential $V_{fg}$ closer to zero potential (i.e., to a less-negative value) and reduces the value of the right side of expression [1].

Multi-level substrate configurations have been developed that provide an isolated region of material that can hold a charge and provide a bias for components carried on the substrate. Such a "deep n-well" configuration may be embodied in an isolated volume of n-type material within the substrate that allows selectively imposing a bias in the substrate in the vicinity of selected devices carried upon the substrate.

Figure 6:
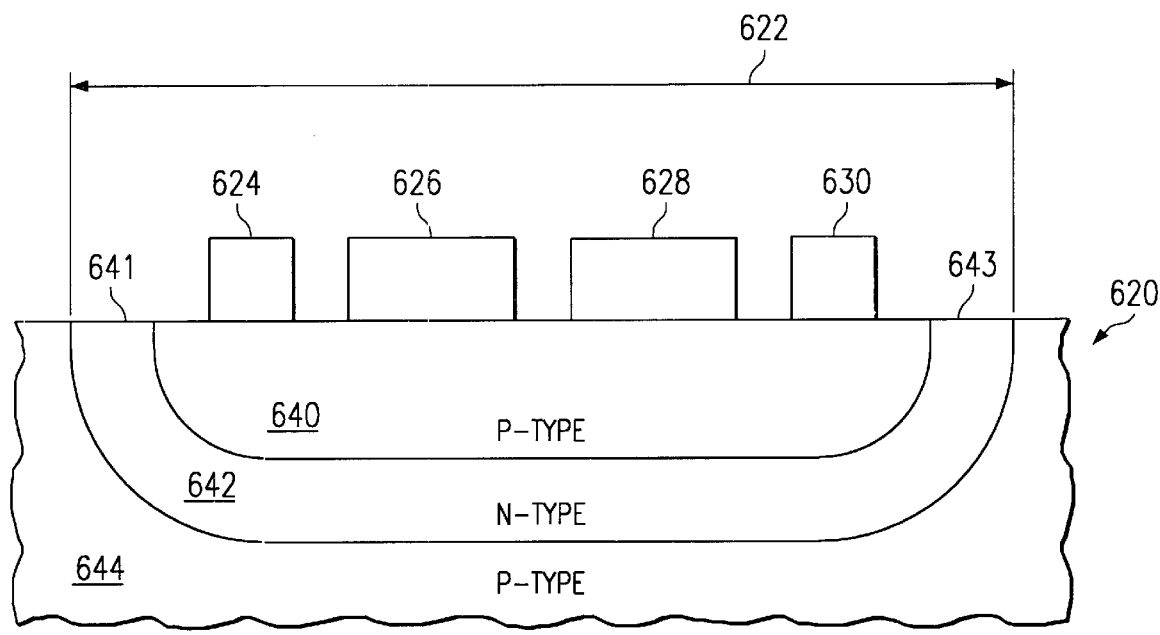
FIG. 6 is a schematic elevation section view of an alternate embodiment of a flash memory array.

FIG. 6 is a schematic elevation section view of an alternate embodiment of a flash memory array. In FIG. 6, an electronic product 610 includes electronic devices 624, 626, 628, 630 that occupy an area 622 on a substrate 620. At least one electronic device 624, 626, 628, 630 requires a bias potential. Substrate 620 is a multi-layer substrate that includes a first substrate layer 640 constructed of p-type material, a second substrate layer 642 constructed of n-type material and a third substrate layer 644 constructed of p-type material. Second substrate layer 642 is situated intermediate first substrate layer 640 and third substrate layer 644. Second substrate layer 642 spans an area generally at least as large as area 622. Second substrate layer 642 is isolated within substrate 620 so that second substrate layer 620 may be charged to provide a substantially permanent bias potential to support operations of selected of electronic devices 624, 626, 628, 630 in area 622 of substrate 620. Electronic devices 624, 626, 628, 630 may be embodied as cells in a memory array, similar to flash memory array 50; FIG. 3. Electrical access to second substrate layer 642 may be provided, as indicated by representative access loci 641, 643 at the surface of substrate 620; other access loci may be provided (not shown in FIG. 6).

Tunneling is a conventionally employed method for erasing a cell. In practicing tunneling, a negative bias is applied to the gate of a cell (e.g., at word line 90; FIG. 5) and a positive bias is applied to the body of the device (e.g., at substrate 130; FIG. 5). In practicing such a method it is necessary to isolate the cell array from other circuitry on the affected memory chip. In order to achieve the required isolation, an isolated p-well (e.g., first substrate layer 640) is created using a buried n-layer, also referred to as a deep n-well (e.g., second substrate layer 642).

In such an arrangement, during an erase operation isolated p-well 640 is adjacent the cell to be erased and deep n-well 642 is adjacent to and isolates isolated p-well 640. Both isolated p-well 640 and deep n-well 642 may be raised to a positive voltage while the gate of cell to be erased (e.g., word line 90; FIG. 5) is subjected to a negative voltage to initiate tunneling and effect erasing of the cell.

When second substrate layer 642 is at a potential equal to or more positive than the potential of third substrate layer 644, then a base voltage $V_b$ can be applied to first substrate layer 640 that is equal to or more negative than the potential on second substrate layer 642 without affecting the potential on third substrate layer 644. For example, third substrate layer 644 and second substrate layer 642 can be set to a potential of 0 volts in a common configuration. Such an arrangement permits applying a base voltage $V_b \leq 0$ volts to an array located in area 622 without affecting substrate potential, or base voltage $V_b$ in circuitry outside of area 622.

Figure 7:
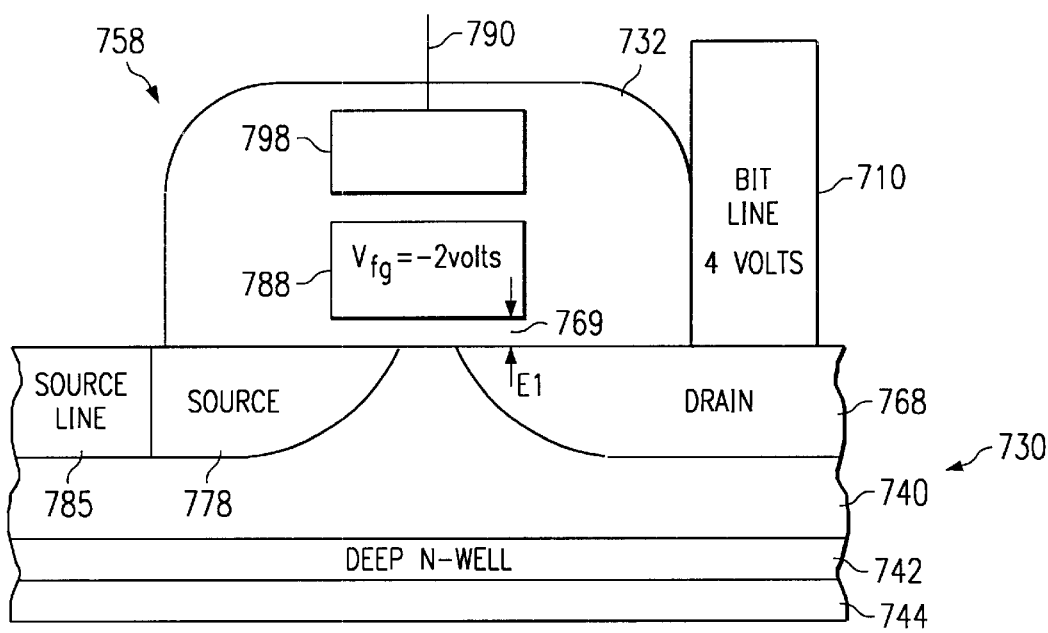
FIG. 7 is a schematic elevation section view of a flash memory cell employed in the alternate embodiment array illustrated in FIG. 6.

FIG. 7 is a schematic elevation section view of a flash memory cell employed in the alternate embodiment array illustrated in FIG. 6. In FIG. 7, a memory cell 758 includes a drain 768 preferably fashioned of n-type material, a source 778 preferably fashioned of n-type material and a source line 785 arrayed upon a substrate 730. Drain 768 is connected with bit line 710. Source 778 is connected with source line 785. Source line 785 is coupled to ground potential at a common juncture (see FIGS. 3 and 4; not shown in FIG. 7). Memory cell 758 further includes an oxide deposition 732 substantially enclosing a floating gate 788 and a capacitor 798. Capacitor 798 is connected with a word line 790.

When another memory cell commonly attached with bit line 710 (not shown in FIG. 7) is configured for programming, as discussed in connection with FIGS. 3 and 4, memory cell 758 (and other memory cells connected with bit line 710) is affected. A potential of 4 volts is present at bit line 710 because bit line 710 is involved in selecting another memory cell commonly connected with bit line 710 as the selected programming cell (see discussion in connection with FIGS. 3 and 4). The programming potential (4 volts) at bit line 710 places substantially the same potential at drain 768.

The inventors have discovered that applying a positive potential at word line 790 connected with memory cell 758 reduces an electric field E1 across junction 769 between drain 768 and floating gate 788. In the preferred embodiment of the present invention a positive potential is applied to word line 790 of non-selected memory cell 758. Preferably a positive potential is also applied to other word lines connected with other non-selected memory cells connected in common with bit line 710 designating a selected cell for programming operations. A representative value for the positive potential applied to word line 790 (and other word lines) is about 0.8 volts In the most preferred embodiment of the present invention, the bias of substrate 730 is also set by controlling base voltage $V_b$ in first substrate layer 740 (in a manner as described in connection with FIG. 6) during programming operations of other memory cells commonly connected with bit line 710. A representative value for the bias potential provided by first substrate layer 740 (i.e., base voltage $V_b$) is about −1 volt.

The potential on word line 790 reduces gate induced drain leakage (GIDL):

$$GIDL = f(V_d - V_{fg}) \quad [1]$$

That is, the potential on word line 790 reduces the value $(V_d - V_{fg})$, thereby reducing current attributable to GIDL and thereby reducing program disturb. Providing a base voltage $V_b \leq 0$ volts on first substrate layer 740 reverse-biases source 778. Reverse biasing of source 778 is assured because source 778 is grounded at zero volts during programming operations (see FIG. 3). The reverse biasing of source 778 prevents undesired programming of erased cells sharing the same bit line 710. Establishing base voltage $V_b \leq 0$ volts also helps to reduce electric field E1 across junction 769.

The physical displacement among charged segments of memory cell 758 (drain 768, floating gate 788, word line 790, and substrate 730) and the geometry of memory cell 758 render direct algebraic calculation of relative charges inaccurate. The inventors have observed that placing a potential of 0.8 volts at word line 790 in a memory cell configured with a small expanse of junction 769 between floating gate 788 and drain 768, and with a −1 volt bias (i.e., base voltage $V_b$) imposed in first substrate layer 740 will yield an effective potential at floating gate 788 of about −1.5 volts. In those conditions, the argument of expression [1] may be calculated to yield:

$$(V_d - V_{fg}) = (4 - (-1.5)) = 5.5 \text{ volts} \quad [2]$$

Such a 0.5 volt advantage realized over the prior art method and apparatus for programming a flash memory device by employing the apparatus or method of the present invention significantly reduces the susceptibility of floating gate 788 to disturbance while programming other memory cells connected in common with bit line 710. Gate induced drain leakage (GIDL) is reduced.

Figure 8:
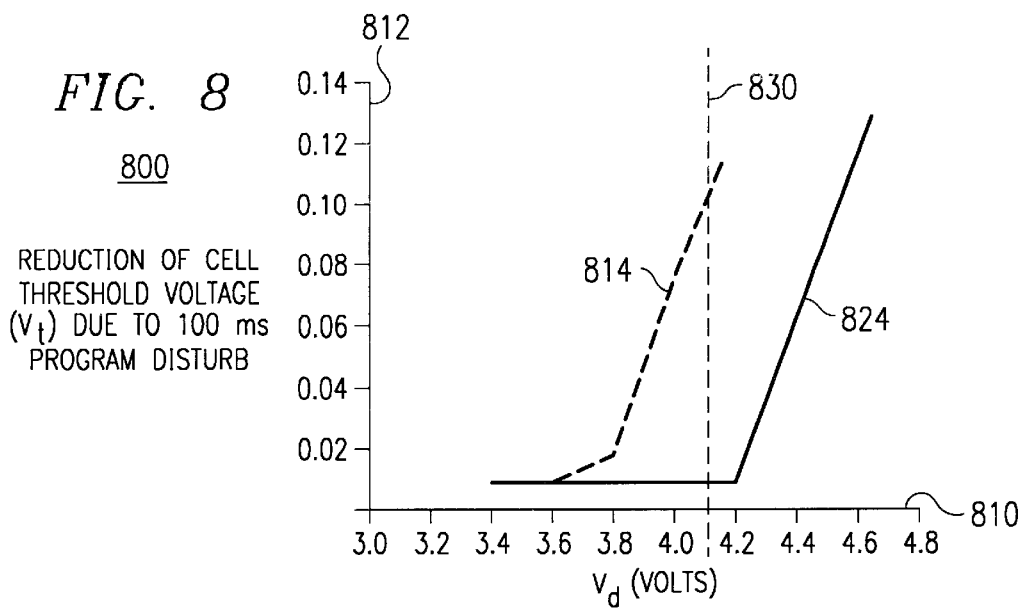
FIG. 8 is a graphic plot of representative data regarding the measured effect of a 100 millisecond program disturb stress on the threshold voltage of a memory cell as a function of programming voltage.

FIG. 8 is a graphic plot of representative data regarding the measured effect of a 100 millisecond program disturb stress on the threshold voltage of a memory cell as a function of programming voltage. In FIG. 8, a family of curves in a plot 800 represents the decrease in threshold voltage $V_t$ of a programmed cell resulting from a bit line stress or program disturb stress having a duration of 100 millisecond (ms) as a function of drain voltage $V_d$ used to program another cell on the same bit line. The decrease in threshold voltage $V_t$ is caused by gate induced drain leakage (GIDL). Recalling expression [1]:

$$GIDL = f(V_d - V_{fg}) \quad [1]$$

$V_d$=drain potential;
$V_{fg}$=floating gate potential

Plot 800 includes a horizontal axis 810 indicating drain potential $V_d$ (in volts) and a vertical axis 812 indicating reduction of threshold voltage $V_t$ (in volts) after 100 milliseconds (ms) of program disturb stress. That is, an initial threshold voltage $V_{t1}$ is measured for a particular memory cell represented by plot 800 before an other cell on the same bit line is programmed. After another memory cell on the same bit line is subjected to a predetermined programming voltage for the prescribed duration (e.g., 100 milliseconds), a second threshold voltage $V_{t2}$ is measured for the particular memory cell. The difference $(V_{t1} - V_{t2})$ is the value plotted on axis 812 of plot 800.

Curve 814 represents response of a system having gate potential $V_{fg}$=0 volt (e.g., voltage at floating gate 788; FIG. 7) and base voltage $V_b$=−1.0 volt (e.g., at first substrate layer 740; FIG. 7). Thus, curve 814 represents the prior art approach to deselecting cells by setting word line potential=0 (e.g., word line 790; FIG. 7), but with a base voltage $V_b$=−1.0 volt to enable a straightforward comparison for evaluating the present invention. Curve 824 represents system response when the present invention is employed. The system represented by curve 824 has a word line potential=0.8 volt and base voltage $V_b$−1.0 volt.

Compare curves 814, 824 at any particular drain voltage $V_d$, as at $V_d$=4.1 volts (at reference value 830). The comparison indicates that increasing word line potential from 0 volts to 0.8 volts while keeping base voltage $V_b$=−1.0 volt eliminates the change to threshold voltage $V_t$ caused by a 100 ms program disturb stress. This result is obtained because GIDL is reduced by reducing the value of expression [1]:

$$GIDL = f(V_d - V_{fg}) \quad [1]$$

Figure 9:
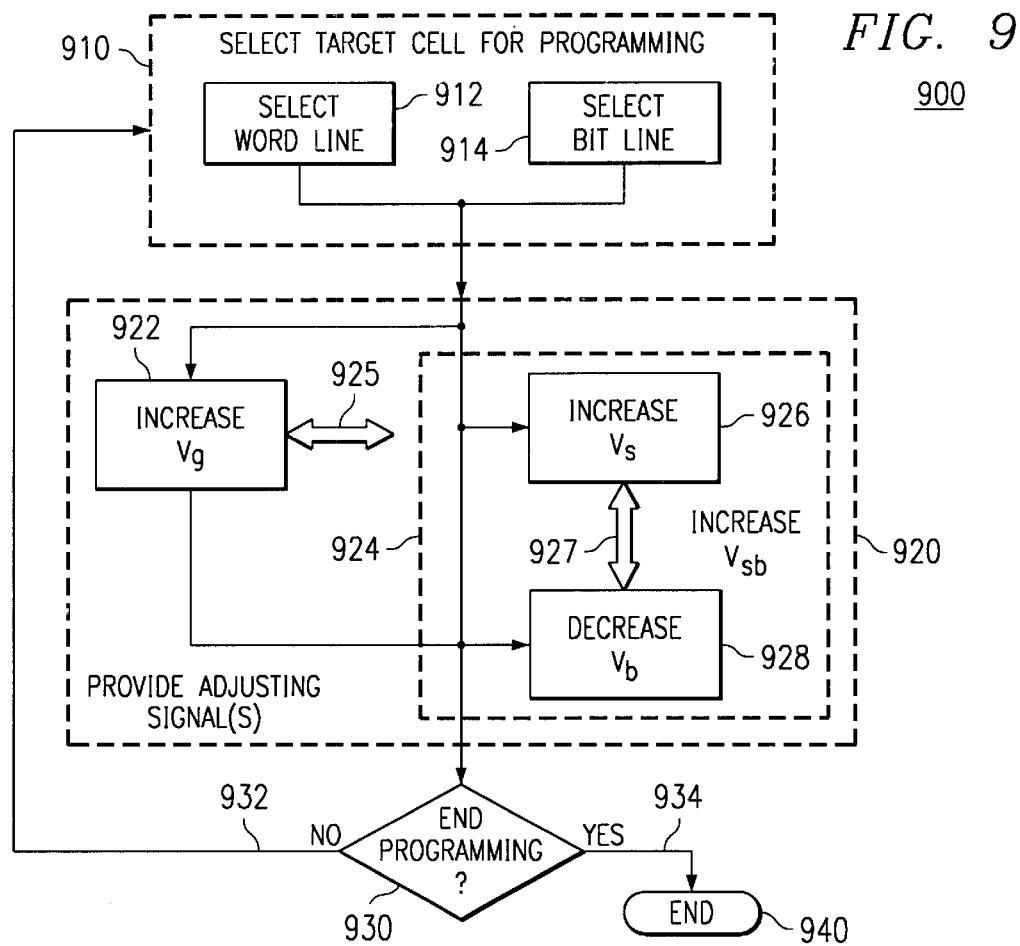
FIG. 9 is a schematic flow diagram illustrating the preferred embodiment of the method of the present invention.

FIG. 9 is a schematic flow diagram illustrating the preferred embodiment of the method of the present invention. In FIG. 9, a method 900 for programming a flash memory device is described. The flash memory device includes a plurality of flash memory cells arranged in an array having at least one word line and at least one bit line. Each respective cell of the plurality of cells has a respective drain, a respective source, a respective gate and a respective floating gate arrayed upon a base that is common with the plurality of cells. The respective drain, the respective source, the respective gate, the respective floating gate and the base cooperate to establish a floating gate-to-source electromagnetic field in each the respective cell. Selected cells of the plurality of cells are connected in a word group with each respective word line of the at least one word line. Selected cells of the plurality of cells are connected in a bit group with each respective bit line of the at least one bit line. An intersection of an individual respective the word line and an individual respective bit line identifies an individual cell of the plurality of cells. Method 900 begins with the step of identifying, or selecting a target cell for programming, as indicated by a block 910. The identifying is effected by the steps of applying, in no particular order:

(1) a word select signal to a particular word line of the at least one word line, as indicated by a block 912 within block 910. The particular word line is coupled with the target cell; and (2) a bit select signal to a particular bit line of the at least one bit line, as indicated by a block 914 within block 910. The particular bit line is coupled with the target cell.

Method 900 continues with the step of providing adjusted signals to the selected cells in the bit group coupled with the particular bit line, as indicated by a block 920. The adjusted signals are chosen appropriately to effect decreasing the strength of the floating gate-to-drain electromagnetic field for the selected cells in the bit group coupled with the particular bit line.

Method 900 continues by posing a query, "End programming?", as indicated by a query block 930. If programming is not ended, method 900 proceeds via "No" response line 932 to block 920 and method 900 carries on as previously described. If programming is ended, method 900 proceeds via "Yes" response line 934 to end, as indicated by end block 940. In such manner, method 900 maintains the adjusted signals applied to the selected cells in the bit group coupled with the particular bit line at least until programming of the target cell is completed.

Providing adjusted signals to the selected cells in a bit group coupled with a particular bit line may be carried out by increasing voltage $V_g$ applied to respective gates of the selected cells, as indicated by a block 922 within block 920. In the alternative, providing adjusted signals to the selected cells in a bit group coupled with a particular bit line may be carried out by increasing the source-to-base voltage differential $V_{sb}$ for selected cells, as indicated by a block 924 within block 920. Still another alternative is to increase voltage $V_g$ and increase voltage differential $V_{sb}$ simultaneously, as indicated by double-ended arrow 925.

Increasing voltage differential $V_{sb}$ for a respective cell may be effected by increasing voltage applied to the source (source voltage $V_s$) of a respective cell, as indicated by a block 926 within block 924. In the alternative, increasing voltage differential $V_{sb}$ for a respective cell may be effected by decreasing voltage applied to the base (base voltage $V_b$), as indicated by a block 928 within block 924. Still another alternative is to increase source voltage $V_s$ and decrease base voltage differential $V_b$ simultaneously, as indicated by double-ended arrow 927.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A method for programming a flash memory device; said flash memory device including a plurality of flash memory cells arranged in an array having at least one word line and at least one bit line; each respective cell of said plurality of cells having a respective drain, a respective source, a respective gate and a respective floating gate arrayed upon a base; said base being common with said plurality of cells; said respective drain, said respective source, said respective gate, said respective floating gate and said base cooperating to establish a floating gate-to-source electromagnetic field in each said respective cell; selected cells of said plurality of cells being connected in a word group with each respective word line of said at least one word line; selected cells of said plurality of cells being connected in a bit group with each respective bit line of said at least one bit line; an intersection of an individual said respective said word line and an individual said respective bit line identifying an individual cell of said plurality of cells; the method comprising the steps of:
    (a) identifying a target cell for programming; said identifying being effected by the steps of applying, in no particular order:
        (1) a word select signal to a particular word line of said at least one word line; said particular word line being coupled with said target cell; and
        (2) a bit select signal to a particular bit line of said at least one bit line; said particular bit line being coupled with said target cell;
    (b) providing adjusted signals to said selected cells in said bit group coupled with said particular bit line to effect decreasing strength of said floating gate-to-drain electromagnetic field for said selected cells in said bit group coupled with said particular bit line;
    (c) programming said target cell; and
    (d) maintaining said adjusted signals at least until said programming of said target cell is completed.

2. A method for programming a flash memory device as recited in claim 1 wherein said providing adjusted signals is effected by increasing voltage applied to said respective gate for said selected cells in said bit group coupled with said particular bit line.

3. A method for programming a flash memory device as recited in claim 1 wherein said providing adjusted signals is effected by increasing source-to-base voltage differential for said selected cells in said bit group coupled with said particular bit line.

4. A method for programming a flash memory device as recited in claim 3 wherein said increasing said source-to-base voltage differential is effected by increasing voltage applied to said respective source for said selected cells in said bit group coupled with said particular bit line.

5. A method for programming a flash memory device as recited in claim 3 wherein said increasing said source-to-base voltage differential is effected by decreasing voltage applied to base.

6. A method for programming a flash memory device as recited in claim 3 wherein said increasing said source-to-base voltage differential is effected by increasing voltage applied to said respective source for said selected cells in said bit group coupled with said particular bit line and by decreasing voltage applied to said base.

7. A method for programming a flash memory device as recited in claim 2 wherein said providing adjusted signals is further effected by increasing source-to-base voltage differential for said selected cells in said bit group coupled with said particular bit line.

8. A method for programming a flash memory device as recited in claim 7 wherein said increasing said source-to-base voltage differential is effected by increasing voltage applied to said respective source for said selected cells in said bit group coupled with said particular bit line.

9. A method for programming a flash memory device as recited in claim 7 wherein said increasing said source-to-base voltage differential is effected by decreasing voltage applied to base.

10. A method for programming a flash memory device as recited in claim 7 wherein said increasing said source-to-base voltage differential is effected by increasing voltage applied to said respective source for said selected cells in said bit group coupled with said particular bit line and by decreasing voltage applied to said base.

11. A method for treating a flash memory cell array while programming a flash memory cell in said flash memory cell array; said flash memory cell array having a plurality of addressable cells; said flash memory cell array having a plurality of bit lines; each respective bit line of said plurality of bit lines being coupled with at least one respective bit-coupled cell of said plurality of addressable cells; said flash memory cell array having a plurality of word lines; each respective word line of said plurality of word lines being coupled with at least one respective word-coupled cell of said plurality of addressable cells; respective cells of said plurality of addressable cells being coupled with at least one word line of said plurality of word lines and with at least one bit line of said plurality of bit lines; a respective word line-bit line combination identifying a particular said addressable a cell as a target cell; each respective cell of said plurality of addressable cells having a respective drain, a respective source, a respective gate and a respective floating gate arrayed upon a base; said base being common to at least some cells of said plurality of addressable cells; said respective drain, said respective source, said respective gate, said respective floating gate and said base cooperating to establish a floating gate-to-source electromagnetic field in each said respective cell; the method comprising the steps of:

(a) selecting said target cell for programming; said selecting being effected by the steps of applying, in no particular order:
(1) a word select programming signal to a particular word line of said plurality of word lines; said particular word line being coupled with said target cell; and
(2) a bit select programming signal to a particular bit line of said plurality of bit lines; said particular bit line being coupled with said target cell;
(b) providing at least one adjusted signal to said at least one respective bit-coupled cell coupled with said particular bit line; said at least one adjusted signal effecting a decrease in strength of said floating gate-to-drain electromagnetic field for said at least one respective bit-coupled cell coupled with said particular bit line;
(c) programming said target cell; and
(d) maintaining said at least one adjusted signal at least until said programming of said target cell is complete.

12. A method for programming a flash memory device as recited in claim 11 wherein said providing at least one adjusted signals is effected by increasing voltage applied to said respective gate for said at least one respective bit-coupled cell coupled with said particular bit line.

13. A method for programming a flash memory device as recited in claim 11 wherein said providing adjusted signals is effected by increasing source-to-base voltage differential for said at least one respective bit-coupled cell coupled with said particular bit line.

14. A method for programming a flash memory device as recited in claim 13 wherein said increasing said source-to-base voltage differential is effected by increasing voltage applied to said respective source for said at least one respective bitcoupled cell coupled with said particular bit line.

15. A method for programming a flash memory device as recited in claim 13 wherein said increasing said source-to-base voltage differential is effected by decreasing voltage applied to base.

16. A method for programming a flash memory device as recited in claim 13 wherein said increasing said source-to-base voltage differential is effected by increasing voltage applied to said respective source for said at least one respective bitcoupled cell coupled with said particular bit line and by decreasing voltage applied to said base.

17. A method for programming a flash memory device as recited in claim 12 wherein said providing adjusted signals is further effected by increasing source-to-base voltage differential for said at least one respective bit-coupled cell coupled with said particular bit line.

18. A method for programming a flash memory device as recited in claim 17 wherein said increasing said source-to-base voltage differential is effected by increasing voltage applied to said respective source said at least one respective bit-coupled cell coupled with said particular bit line.

19. A method for programming a flash memory device as recited in claim 17 wherein said increasing said source-to-base voltage differential is effected by decreasing voltage applied to base.

20. A method for programming a flash memory device as recited in claim 17 wherein said increasing said source-to-base voltage differential is effected by increasing voltage applied to said respective source for said at least one respective bit-coupled cell coupled with said particular bit line and by decreasing voltage applied to said base.

21. A flash memory device configured for programming a target cell among a plurality of addressable cells arranged in an array; said array having a plurality of bit lines; each respective bit line of said plurality of bit lines being coupled with at least one respective bit-coupled cell of said plurality of addressable cells; said array having a plurality of word lines; each respective word line of said plurality of word lines being coupled with at least one respective word-coupled cell of said plurality of addressable cells; respective cells of said plurality of addressable cells being coupled with at least one word line of said plurality of word lines and with at least one bit line of said plurality of bit lines; a respective word line-bit line combination identifying a particular said addressable a cell as said target cell; each respective cell of said plurality of addressable cells having a respective drain, a respective source, a respective gate and a respective floating gate arrayed upon a base; said base being common to at least some cells of said plurality of addressable cells; said respective drain, said respective source, said respective gate, said respective floating gate and said base cooperating to establish a floating gate-to-source electromagnetic field in each said respective cell; a word select programming signal being applied to a particular word line of said plurality of word lines; said particular word line being coupled with said target cell; a bit select programming signal being applied to a particular bit line of said plurality of bit lines; said particular bit line being coupled with said target cell; at least one adjusted signal being provided to said at least one respective bit-coupled cell coupled with said particular bit line; said at least one adjusted signal effecting a decrease in strength of said floating gate-to-drain electromagnetic field for said at least one respective bit-coupled cell coupled with said particular bit line at least during said programming of said target cell.

* * * * *